United States Patent
Morimoto et al.

(10) Patent No.: US 6,515,468 B1
(45) Date of Patent: Feb. 4, 2003

(54) CURRENT SENSOR AND ELECTRIC CIRCUIT USING THE SAME

(75) Inventors: Mitsuaki Morimoto, Shizuoka-ken (JP); Yasuhiro Tamai, Shizuoka-ken (JP); Yoshinori Ikuta, Shizuoka-ken (JP); Takashi Gohara, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/644,681

(22) Filed: Aug. 24, 2000

(30) Foreign Application Priority Data

Aug. 27, 1999 (JP) ............................................. 11-241759

(51) Int. Cl.⁷ ............................................. G01R 33/00
(52) U.S. Cl. .................................. 324/117 H; 324/251
(58) Field of Search ........................ 324/117 H, 117 R, 324/127, 207.2, 251; 327/511; 338/32 H (56) References Cited

U.S. PATENT DOCUMENTS

| | | | | |
|---|---|---|---|---|
| 4,460,867 A | * | 7/1984 | Fleissner | ................ 324/117 H |
| 4,639,665 A | * | 1/1987 | Gary | ...................... 324/117 H |
| 4,901,008 A | * | 2/1990 | Quastel et al. | .......... 324/117 H |
| 5,296,802 A | * | 3/1994 | Beranger et al. | ....... 324/117 R |
| 5,583,429 A | * | 12/1996 | Otaka | ..................... 324/117 H |
| 5,831,425 A | * | 11/1998 | Ochiai | .................... 324/117 R |
| 6,008,634 A | * | 12/1999 | Murofushi et al. | ..... 324/117 H |

FOREIGN PATENT DOCUMENTS

JP 6-174753 6/1994

* cited by examiner

*Primary Examiner*—Christine Oda
*Assistant Examiner*—Vincent Q. Nguyen
(74) *Attorney, Agent, or Firm*—Finnegan, Henderson, Farabow, Garrett, & Dunner, L.L.P.

(57) ABSTRACT

A current sensor including a cabinet 10, a sensor conductor 20 partially accommodated in the cabinet 10 and secured to the cabinet 10 and having opposite ends pulled out from the cabinet 10, and a Hall element 30 accommodated in the cabinet 10 and secured to the cabinet 10, and disposed in the vicinity of the sensor conductor 20. An electric circuit including the current sensor, and a wire conductor 60 used for wiring of the electric circuit and having fitting portions 61 to be fitted to terminals 1 and 2 of the sensor conductor 20 of the current sensor.

5 Claims, 10 Drawing Sheets

CURRENT SENSOR AND ELECTRIC CIRCUIT USING THE SAME

BACKGROUND OF THE INVENTION

1. Field of the Invention

The present invention relates to a current sensor for detecting a current flowing through an electric circuit mounted to equipment such as an automobile and an electric circuit using this current sensor, and more particularly, to a technique for enhancing a detection precision of a current.

2. Description of Related Art

There is a conventionally known current sensor for detecting a current flowing through an electric circuit mounted in, e.g., an automobile using a Hall element which is one of magnetic-electric power converting element. One example of such current sensors is disclosed as "Large current detecting apparatus" in Japanese Patent Application Laid-open No. H6-174753.

Figure 1:
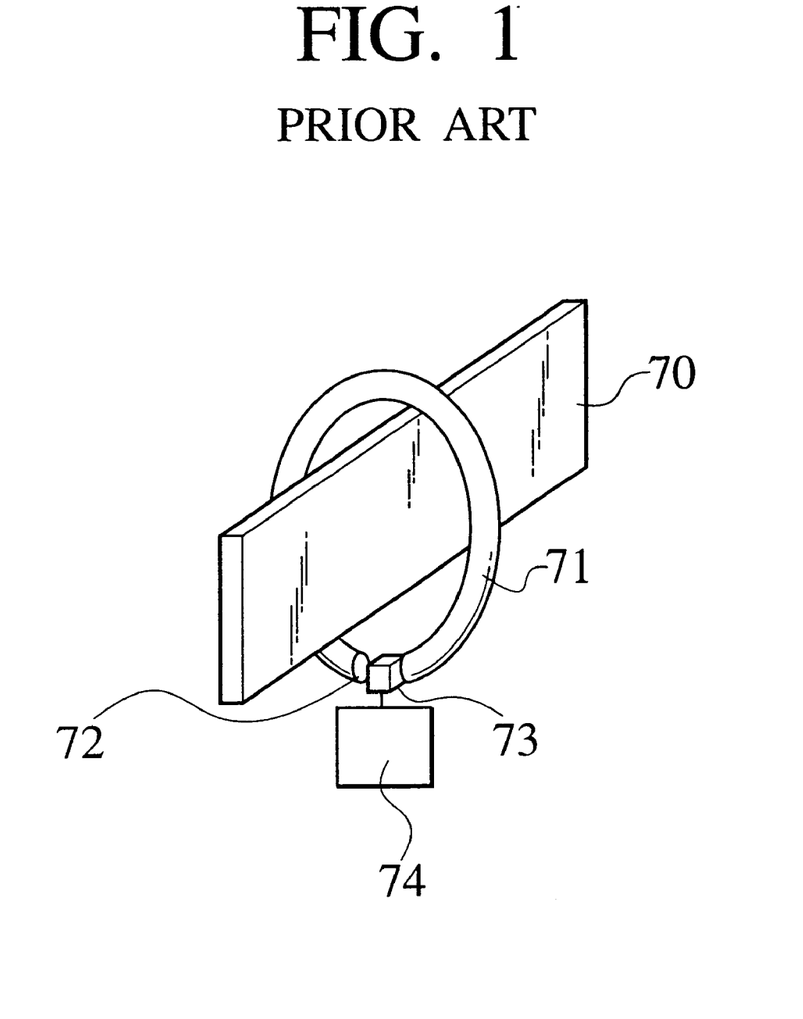
FIG. 1 is a view for explaining a conventional current sensor.

As shown in FIG. 1, this large current detecting apparatus comprises a busbar 70, and a magnetic flux detector 71 as a magnetic-force collecting core wound around the busbar 70. The magnetic flux detector 71 comprises a flexible bag-like body having ferrite powder therein, and may be formed into an arbitrary shape.

A Hall element 73 is provided in a gap 72 formed between both ends of the magnetic flux detector 71, thereby generating, in the Hall element 73, a voltage proportional to a magnetic flux generated by a current flowing through the busbar 70. Based on this voltage, a value of the current flowing through the busbar 70 is displayed on a display unit 74.

According to this conventional large current detecting apparatus, if a positional relation of three parts, i.e., the gap formed between the both ends of the magnetic flux detector, the Hall element and a conductor is not set precisely, the current detecting precision is lowered.

However, in the case of the current detecting apparatus comprising such parts assembled therein, mounting positions of the conductor, the magnetic flux detector and the Hall elements are slightly varied in some cases and therefore, there is a problem that it is difficult to precisely set the positional relation of the above parts and thus, the current detecting precision is lowered.

SUMMARY OF THE INVENTION

The present invention has been achieved to solve the problem of such a conventional current detecting apparatus, and it is an object of the invention to provided a current sensor which is capable of enhancing the current detecting precision and which can be assembled excellently. Another object of the invention is to provide an electric circuit using the above current sensor.

To achieve the above object, according to a first aspect, there is provided a current sensor comprising a cabinet, a sensor conductor partially accommodated in the cabinet and secured to the cabinet and having opposite ends pulled out from the cabinet, and a magnetic-electric power converting element accommodated in the cabinet and secured to the cabinet, and disposed in the vicinity of the sensor conductor.

With the current sensor of the first aspect, both the sensor conductor and the magnetic-electric power converting element are secured to the cabinet and integrally formed together. Therefore, since the positional relation between the magnetic-electric power converting element and the sensor conductor through which a current to be measured flows is precisely determined, it is possible to enhance the detecting precision of a current. Further, since this current sensor does not have a magnetic-force collecting core, the current sensor can be made smaller, and is suitable for detecting a large current. Further, since the current sensor itself can be handled as one part, it is easy to handle the sensor.

According to a second aspect of the invention, the current sensor further comprises a ring-like magnetic-force collecting core secured to the cabinet such that the magnetic-electric power converting element is located in a gap.

With the current sensor of the second aspect, since most of the magnetic flux generated by a current flowing through the sensor conductor is converged by the ring-like magnetic-force collecting core and supplied to the magnetic-electric power converting element, it is possible to detect a small current flowing through the sensor conductor with high precision.

According to a third aspect of the invention, the current sensor further comprises square magnetic-force collecting cores respectively disposed on the cabinet in front of and behind the magnetic-force sensing faces of the magnetic-electric power converting element.

With the current sensor of the third aspect, since the bulk of the magnetic flux generated by a current flowing through the sensor conductor is converged by the square magnetic-force collecting cores and supplied to the magnetic-electric power converting element, it is possible to detect a small or medium current flowing through the sensor conductor with high precision. Further, since the square magnetic-force collecting cores are respectively disposed in front of and behind the magnetic-force sensing faces of the magnetic-electric power converting element, the current sensor can be formed smaller as compared with that of the second aspect.

According to a fourth aspect of the invention, each of opposite ends of the sensor conductor is formed such as to have compatibility with an end of a fuse.

With the current sensor of the fourth aspect, the fuse can be removed and the current sensor can be mounted. Therefore, since it is possible to detect a current flowing through the fuse, it is possible to monitor a state of a load connected through the fuse.

According to a fifth aspect of the invention, the current sensor further comprises a display unit for displaying information corresponding to an electric signal from the magnetic-electric power converting element.

With the current sensor of the fifth aspect, since it is possible to visually check a value of current flowing through the sensor conductor of the current sensor, it is possible to easily examine electric circuits in an assembling line of automobiles and inspect vehicles.

According to a sixth aspect of the invention, there is provided an electric circuit comprising a current sensor including a cabinet, a sensor conductor partially accommodated in the cabinet and secured to the cabinet and having opposite ends pulled out from the cabinet, and a magnetic-electric power converting element accommodated in the cabinet and secured to the cabinet, and disposed in the vicinity of the sensor conductor, and a wire conductor used for wiring of the electric circuit and having fitting portions to be fitted to terminals of the sensor conductor of the current sensor.

With the electric circuit of the sixth aspect, since the current sensor can be mounted only by fitting the terminals of the current sensor to the connecting portions formed on the wire conductor, the mounting operation can be carried out easily.

According to a seventh aspect of the invention, in the electric circuit of the sixth aspect, the wire conductor have branch path formed with fitting portions, the terminals of the sensor conductor of the current sensor are fitted to the fitting portions formed on the branch path.

With the electric circuit of the seventh aspect, since a branch current flowing through the branch path is smaller than a current flowing through the entire wire conductor, it is possible to detect a large current using the magnetic-electric power converting element having a low saturation point.

DESCRIPTION OF THE PREFERRED EMBODIMENTS

Current sensors of embodiments of the present invention will be explained in detail with reference to the drawings below.

First Embodiment

Figure 2:
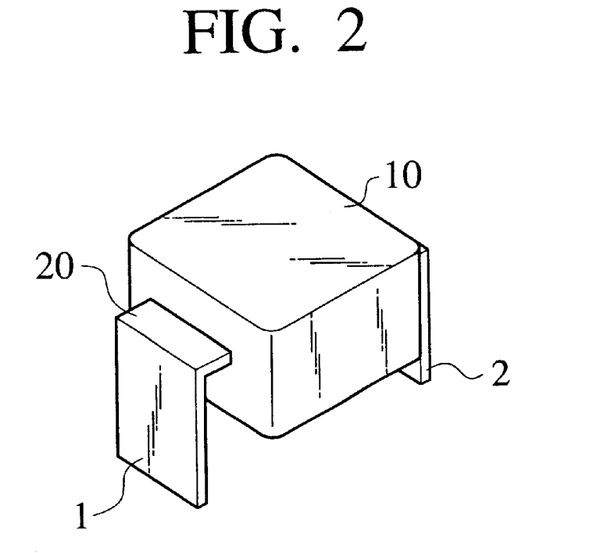
FIG. 2 is a perspective view of an outward appearance of a current sensor according to a first embodiment of the present invention.
Figure 3:
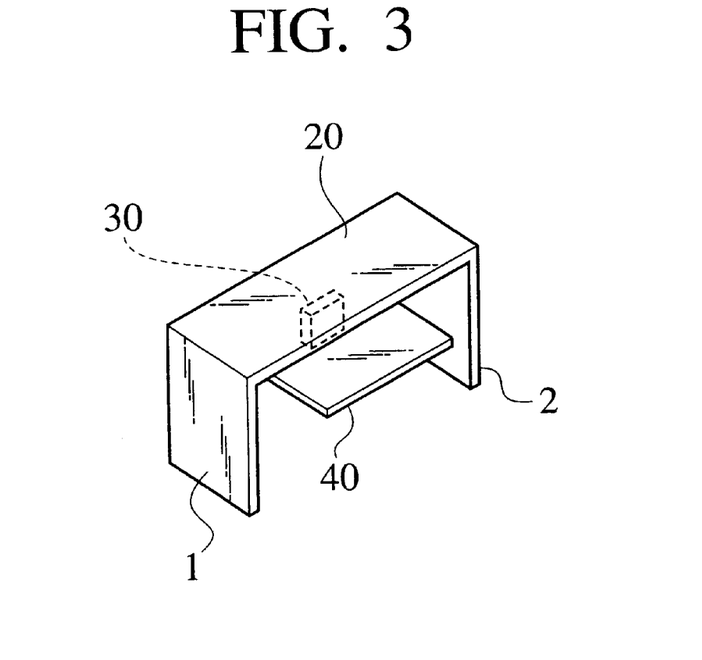
FIG. 3 is a perspective view of the current sensor structure shown in FIG. 2 from which a cabinet is removed.
Figure 4:
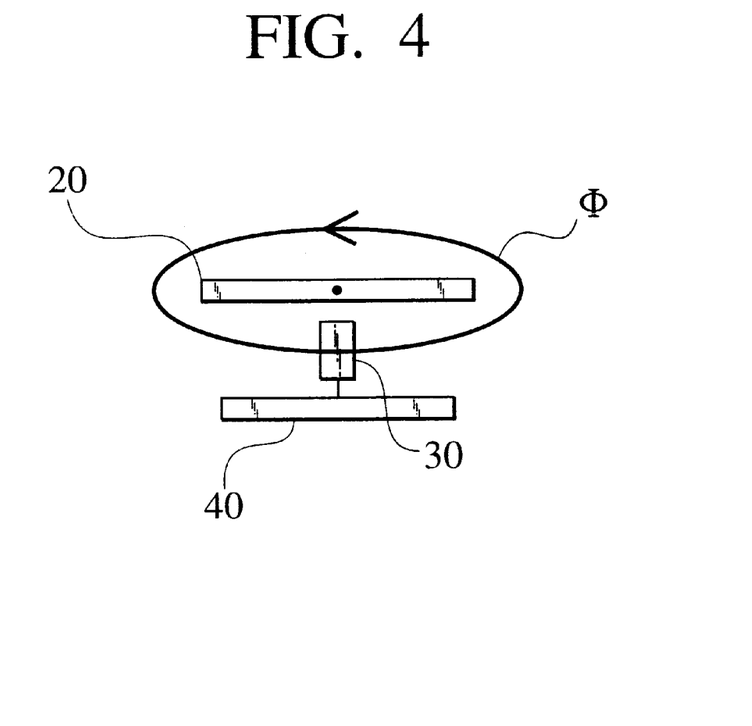
FIG. 4 is a sectional side view of the current sensor structure shown in FIG. 2 from which the cabinet is removed.

FIG. 2 is a perspective view of an outward appearance of a current sensor according to a first embodiment of the invention, FIG. 3 is a perspective view of the current sensor structure from which a cabinet 10 is removed, and FIG. 4 is a sectional side view of the current sensor structure from which the cabinet 10 is removed.

This current sensor includes the cabinet 10 formed into a substantially rectangular parallelepiped shape, and a band-like conductor 20 such as a busbar. This conductor 20 is called as a "sensor conductor" to distinguish from a wire conductor used for wiring of an electric circuit. The sensor conductor 20 is secured to the cabinet 10 such as to project through the cabinet 10 from its one side to the other side opposed to the one side.

A central portion of the sensor conductor 20 is accommodated in the cabinet 10. Opposite ends of the sensor conductor 20 coming out from the cabinet 10 are bent a predetermined positions thereof from the surface of the cabinet 10 such that the sensor conductor 20 is formed into a II-shape. Leg portions of the II-shaped sensor conductor 20 are used as terminals 1 and 2.

A substrate 40 on which a Hall element 30 is mounted is secured in the cabinet 10. The Hall element 30 on the substrate 40 is mounted in the vicinity of the sensor conductor 20 and at a position corresponding to a substantially center of a width of the sensor conductor 20. The Hall element 30 is mounted such that its magnetic-force sensing face is directed perpendicularly to the surface of the sensor conductor 20 and in parallel to a longitudinal direction of the sensor conductor 20.

In the current sensor having the above-described structure, if a current flows through the sensor conductor 20, a magnetic flux Φ of magnitude corresponding to that of a current is generated in accordance with corkscrew rule of ampere as shown in FIG. 4. This magnetic flux Φ enters into the magnetic-force sensing face of the Hall element 30 perpendicularly, and the Hall element 30 outputs a voltage signal which is proportional to a magnetic flux density. Since the voltage signal is proportional to a current flowing through the sensor conductor 20, it is possible to detect the magnitude of a current flowing through the sensor conductor 20 by detecting this voltage signal.

In the current sensor of the first embodiment, both the sensor conductor 20 and the substrate 40 on which the Hall element 30 is mounted are secured to the cabinet 10 as one unit. Therefore, a mounting error of parts is not caused unlike the conventional sensor, and a position of the Hall element 30 with respect to the sensor conductor 20 through which a current to be measured flows is precisely determined. As a result, it is possible to detect a current with high precision.

Further, since this current sensor does not have a ring-like magnetic-force collecting core unlike the conventional sensor, the current sensor can be made smaller. Since the current sensor does not have the magnetic-force collecting core, only a portion of the magnetic flux Φ generated by a current flowing through the sensor conductor 20 is input to the magnetic-force sensing face of the Hall element 30. Therefore, this sensor is suitable for detecting a large current. Further, since the current sensor itself can be handled as one part, it is easy to handle the sensor.

Figure 5:
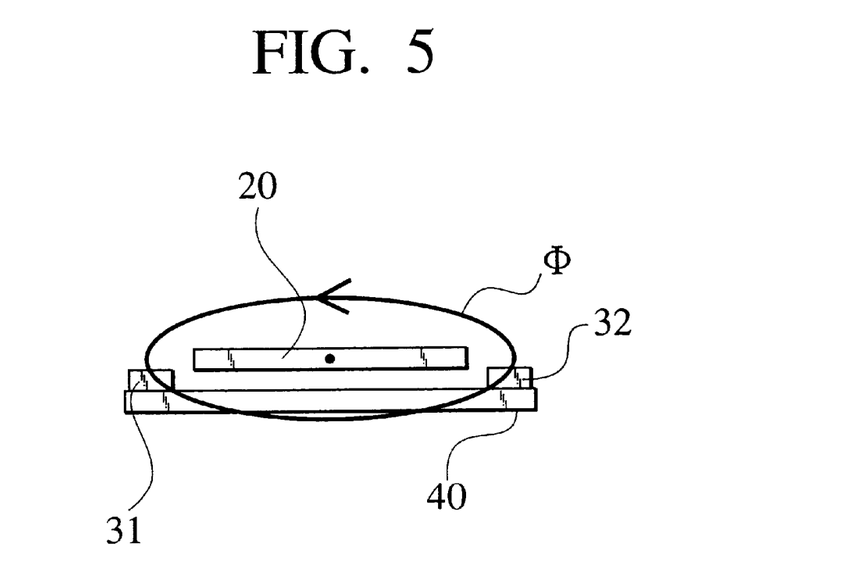
FIG. 5 is a sectional side view of a structure of a modification of the current sensor shown in FIG. 2.

Although the current sensor includes one Hall element 30 in the first embodiment, the current sensor may include two or more Hall element 30. If the sensor includes two Hall element 31 and 32 for example, the Hall element 31 and 32 shown in FIG. 5 may be disposed on the substrate 40 at positions corresponding to the opposite sides or near the opposite sides of the sensor conductor 20 such that magnetic-force sensing faces are directed in parallel to the surface of the substrate 40. With this structure also, the same effect can be exhibited.

Second Embodiment

A current sensor of the second embodiment of the invention is different from that of the above-described first embodiment in that the current sensor has a ring-like magnetic-force collecting core.

Figure 6:
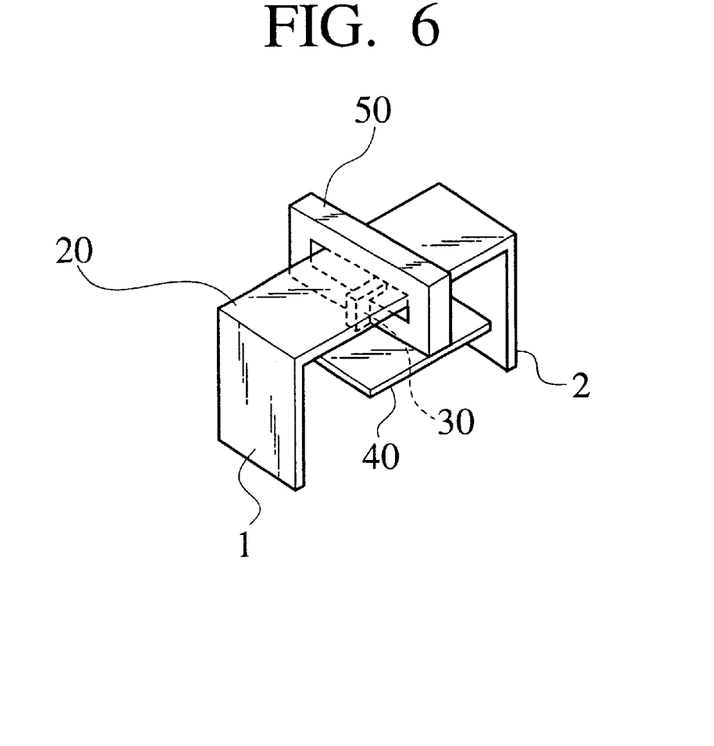
FIG. 6 is a perspective view of a current sensor structure of a second embodiment of the invention from which a cabinet is removed.
Figure 7:
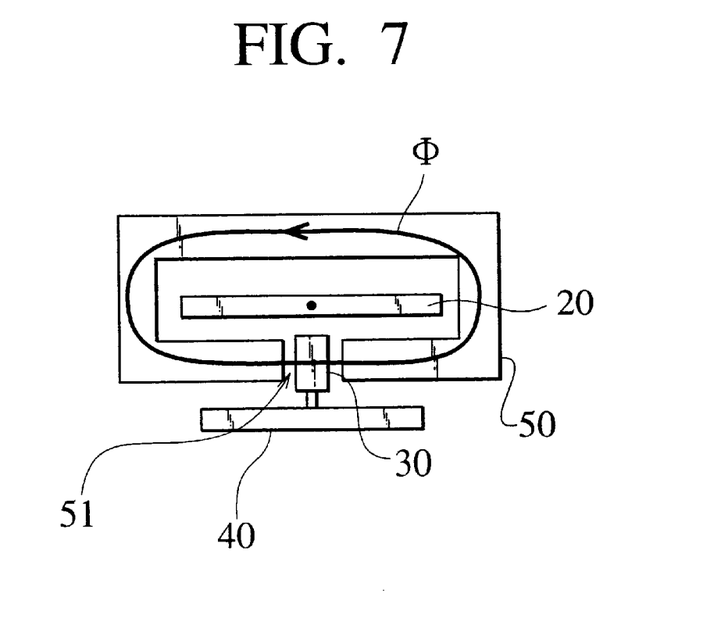
FIG. 7 is a perspective view of the current sensor structure shown in FIG. 6 from which the cabinet is removed.

FIG. 6 is a perspective view of a current sensor structure of the second embodiment of the invention from which a cabinet 10 is removed, and FIG. 7 is a perspective view of the current sensor structure shown in FIG. 6 from which the cabinet 10 is removed.

In addition the structure of the current sensor of the first embodiment, this current sensor of the second embodiment includes a ring-like magnetic-force collecting core 50 having a gap 51. This ring-like magnetic-force collecting core 50 is secured to the substrate 40 such that the Hall element 30 is sandwiched in the gap 51 and the ring-like magnetic-force collecting core 50 surrounds the sensor conductor 20.

In the current sensor having the above-described structure, if a current flows through the sensor conductor 20, a magnetic flux Φ of magnitude corresponding to that of a current is generated in accordance with corkscrew rule of ampere as shown in FIG. 7. Most of this magnetic flux Φ passes through the ring-like magnetic-force collecting core 50, and enters into the magnetic-force sensing face of the Hall element 30 perpendicularly. With this, the Hall element 30 outputs a voltage signal which is proportional to a magnetic flux density. Therefore, it is possible to detect the magnitude of a current flowing through the sensor conductor 20 by detecting this voltage signal.

According to this current sensor of the second embodiment, since most of the magnetic flux Φ generated by a current flowing through the sensor conductor 20 is converged by the ring-like magnetic-force collecting core 50 and supplied to the Hall element 30, it is possible to detect a small current flowing through the sensor conductor 20 with high precision. Therefore, this sensor is suitable for detecting a small current.

Further, in the case of a current sensor using a conventional annular core, a conductor to be measured must be inserted into the annular core when the current sensor is assembled, and this operation is very troublesome.

However, the Hall element 30 and the sensor conductor 20 are integrally formed as in the current sensor of the second embodiment. Therefore, when the current sensor is mounted in a power source distributing apparatus such as a junction box or a relay box in an engine room for example, the current sensor can by mounted only by fitting the terminals 1 and 2 as in the case in which a fuse is mounted, and the mounting operation of the current sensor is extremely easy.

Third Embodiment

A current sensor of the third embodiment of the invention is different from that of the second embodiment in that square magnetic-force collecting cores are used instead of the ring-like magnetic-force collecting core.

Figure 8:
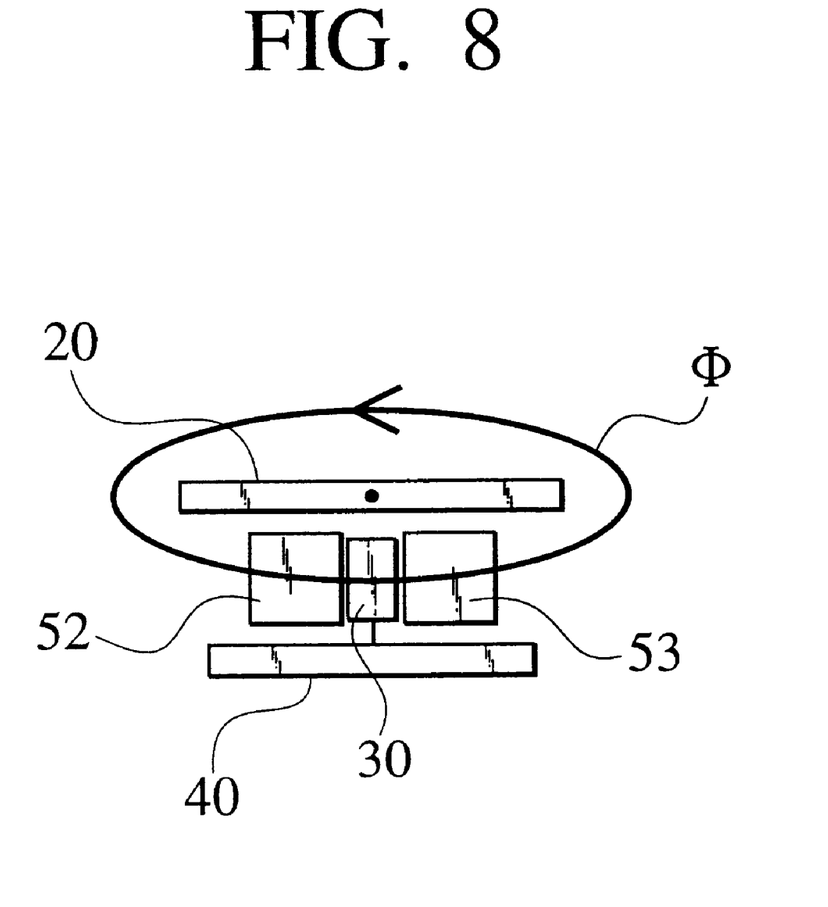
FIG. 8 is a sectional side view of a current sensor structure of a third embodiment of the invention from which a cabinet is removed.

FIG. 8 is a sectional side view of the current sensor structure of the third embodiment of the invention from which the cabinet 10 is removed. This current sensor includes a first square magnetic-force collecting core 52 and a second square magnetic-force collecting core 53 instead of the ring-like magnetic-force collecting core 50 of the current sensor of the second embodiment. The first square magnetic-force collecting core 52 and the second square magnetic-force collecting core 53 are secured to the substrate 40 such that the Hall element 30 is sandwiched therebetween from opposite sides of the Hall element 30. That is, the Hall element 30 is disposed in a gap of a linear-type magnetic-force collecting core comprising the first square magnetic-force collecting core 52 and the second square magnetic-force collecting core 53.

In the current sensor having the above-described structure, if a current flows through the sensor conductor 20, a magnetic flux Φ of magnitude corresponding to that of a current is generated in accordance with corkscrew rule of ampere as shown in FIG. 8. The bulk of this magnetic flux Φ passes through the first square magnetic-force collecting core 52 and the second square magnetic-force collecting core 53, and enters into the magnetic-force sensing face of the Hall element 30 perpendicularly at the position of the gap of the linear-type magnetic-force collecting core. With this, the Hall element 30 outputs a voltage signal which is proportional to a magnetic flux density. Therefore, it is possible to detect the magnitude of a current flowing through the sensor conductor 20 by detecting this voltage signal.

According to the current sensor of the third embodiment, since the bulk of the magnetic flux Φ generated by a current flowing through the sensor conductor 20 is converged by the linear-type magnetic-force collecting core 50 comprising the first square magnetic-force collecting core 52 and the second square magnetic-force collecting core 53, and supplied to the Hall element 30, it is possible to detect a small or medium current flowing through the sensor conductor 20 with high precision. Therefore, this current sensor is suitable for detecting a small or medium current. Further, since the first square magnetic-force collecting core 52 and the second square magnetic-force collecting core 53 are respectively disposed on the substrate 40 in front of and behind the magnetic-force sensing faces of the Hall element 30, the current sensor can be formed smaller as compared with that of the second embodiment.

Fourth Embodiment

A current sensor of the fourth embodiment of the present invention has a detachable measuring device as an optional device.

Figure 9:
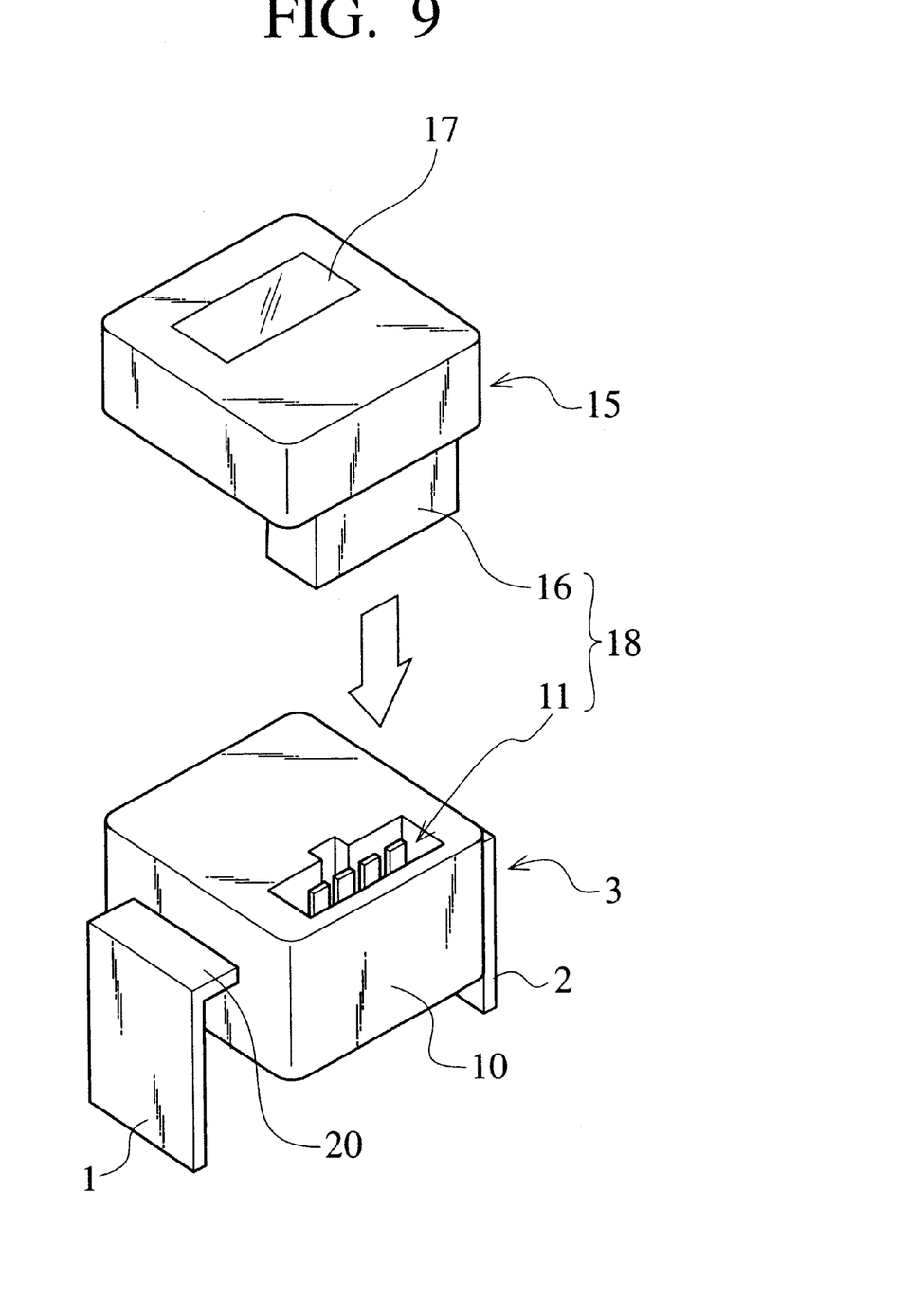
FIG. 9 is a perspective view of outward appearances of a current sensor according to a fourth embodiment of the invention and a measuring device which can be attached and detached to and from the current sensor.

FIG. 9 is a perspective view of outward appearances of a current sensor according to the fourth embodiment of the invention and a measuring device 15 which can be attached and detached to and from the current sensor. The current sensor is formed at its upper face with a connecting portion 11 for connecting the measuring device 15. The connecting portion 11 comprises a male connector for example.

The measuring device 15 includes a connecting portion 16 and a display unit 17. A fitting portion 18 of the present invention comprises the connecting portion 11 of the current sensor 3 and the connecting portion 16 of the measuring device 15. Although it is not illustrated, a signal processing circuit is incorporated in the measuring device 15. The signal processing circuit calculates a current value flowing through the sensor conductor 20 by processing a voltage signal output from the Hall element 30 of the current sensor 3.

The connecting portion 16 of the measuring device 15 comprises a female connector for example so that it is fitted over the connecting portion 11 of the current sensor 3. The display unit 17 is used for displaying the current value obtained by the signal processing circuit. The display unit 17 may comprise an LED, LCD or the like for example.

In the above structure, if the measuring device 15 is mounted to the current sensor 3 by fitting the connecting portion 16 of the measuring device 15 over the connecting portion 11 of the current sensor 3, a current flowing through the sensor conductor 20 is displayed on the display unit 17.

According to the current sensor 3 of the fourth embodiment, a user can visually check a value of current flowing through the sensor conductor 20 of the current sensor 3. Therefore, if the measuring device 15 is mounted to the current sensor 3 if necessary, it is possible to easily examine electric circuits in an assembling line of automobiles and inspect vehicles.

Further, the terminals 1 and 2 of the current sensor 3 of any of the first to fourth embodiments may be formed into the same shape as a terminal of present widely used blade fuse. With this design, when it is desired to monitor a state of a load connected through a fuse, it is possible to easily monitor the state of the load by removing the fuse and mount the current sensor 3 instead.

Fifth Embodiment

The fifth embodiment of the present invention relates to an electric circuit in which the current sensor 3 of any of the first to fourth embodiments, and more particularly, to a structure for connecting a wire conductor of the electric circuit and the current sensor 3.

Figure 10:
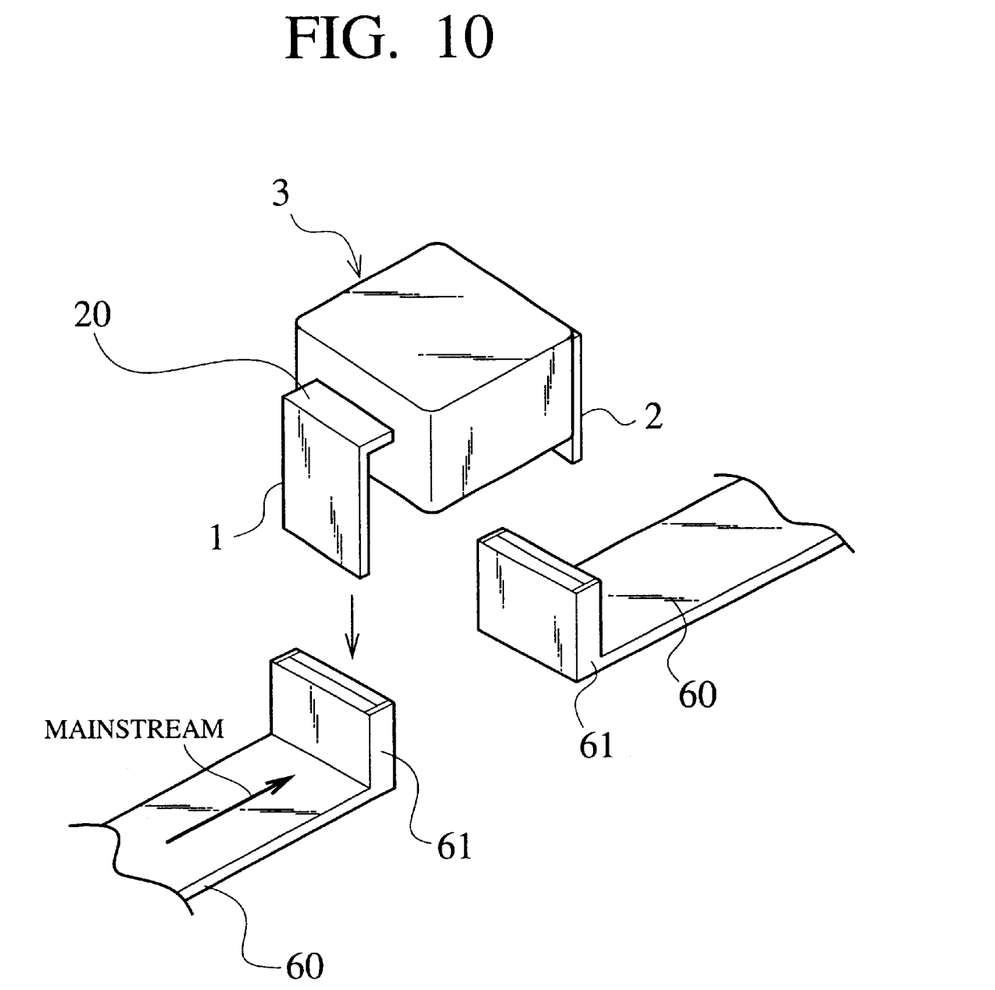
FIG. 10 is a perspective view of a first connecting example (mainstream interrupting type) in an electric circuit according to a fifth embodiment of the invention.
Figure 11A:
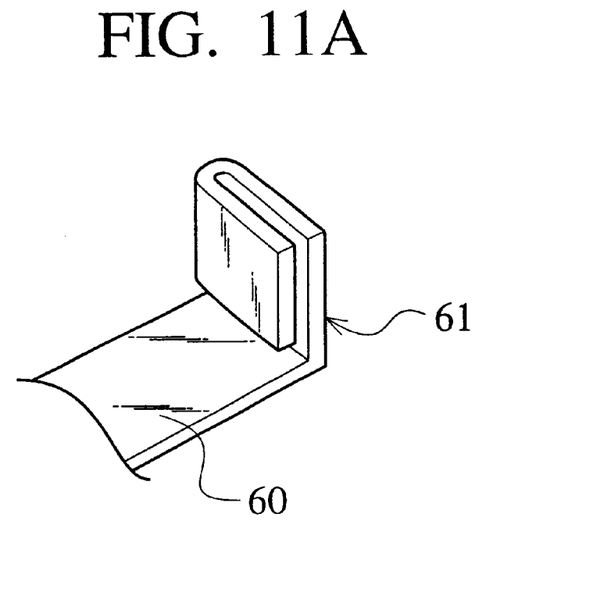
FIGS. 11A and 11B are perspective views of detailed structures of connecting portions formed on a wire conductor shown in FIG. 10.
Figure 11B:
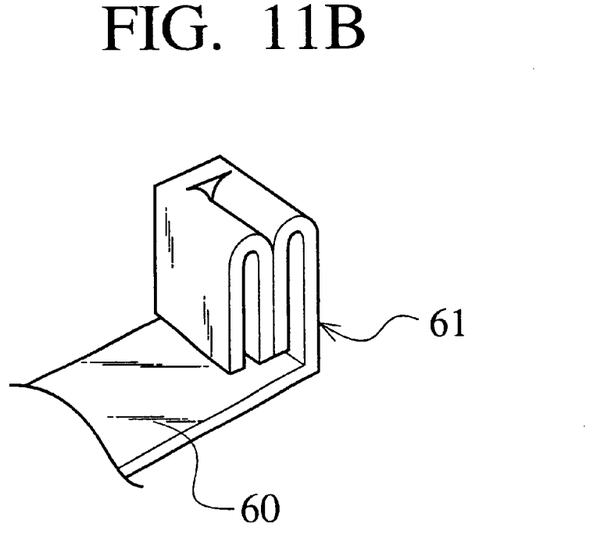

FIG. 10 shows a first connecting example (mainstream interrupting type). In this example, a wire conductor 60 is cut from its medium portion, cut portions of the wire conductor 60 are bent upward at predetermined length positions to form connecting portions 61. The connecting portions 61 are formed such that the terminals 1 and 2 formed at opposite ends of the sensor conductor 20 of the current sensor 3 can be sandwiched. As shown in FIGS. 11A or 11B, each of the connecting portions 61 can be formed by incising a metal plate which is a conductor material and bending its portion when the wire conductor 60 is produced.

Figure 12:
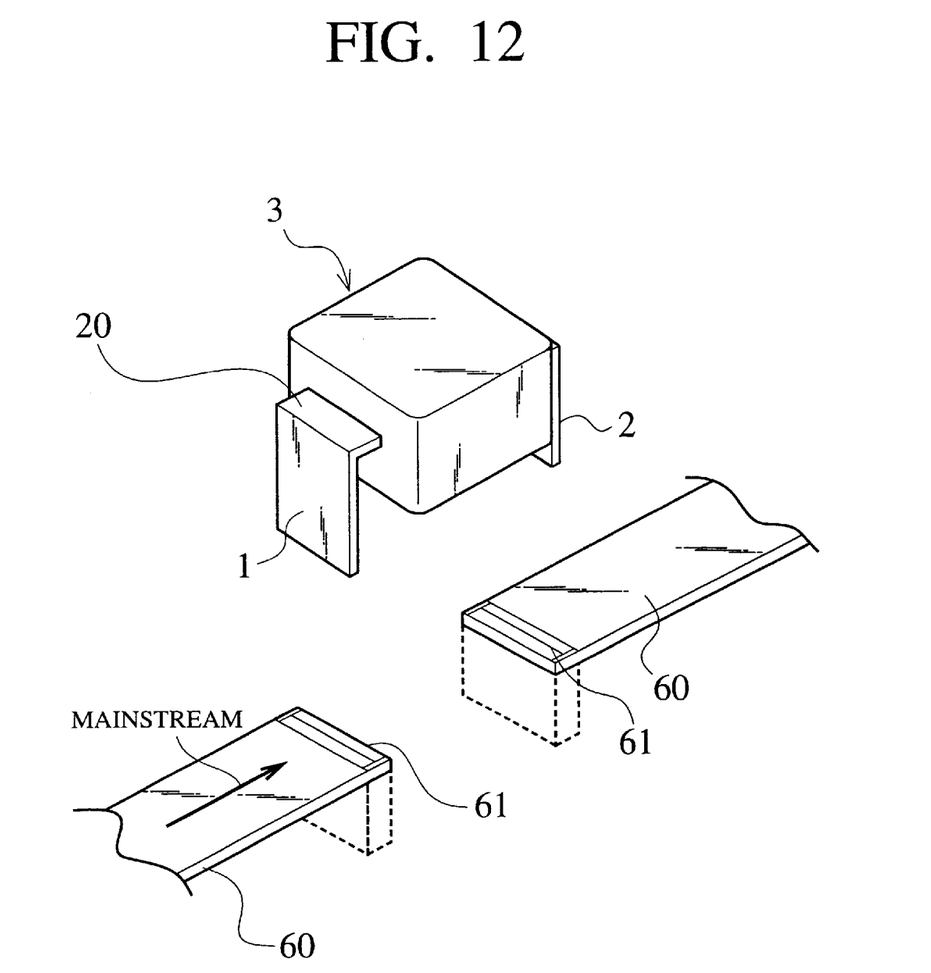
FIG. 12 is a view showing another example of structure of the connecting portion formed on the wire conductor shown in FIG. 10.

In FIG. 10, the ends of the wire conductor 60 are bent upward, but the ends may not be bent or bent downward as shown in FIG. 12.

According to the electric circuit of the fifth embodiment, since the current sensor 3 can be mounted only by fitting the terminals 1 and 2 of the current sensor 3 to the connecting portions 61 formed on the wire conductor 60, the mounting operation can be carried out easily.

Figure 13:
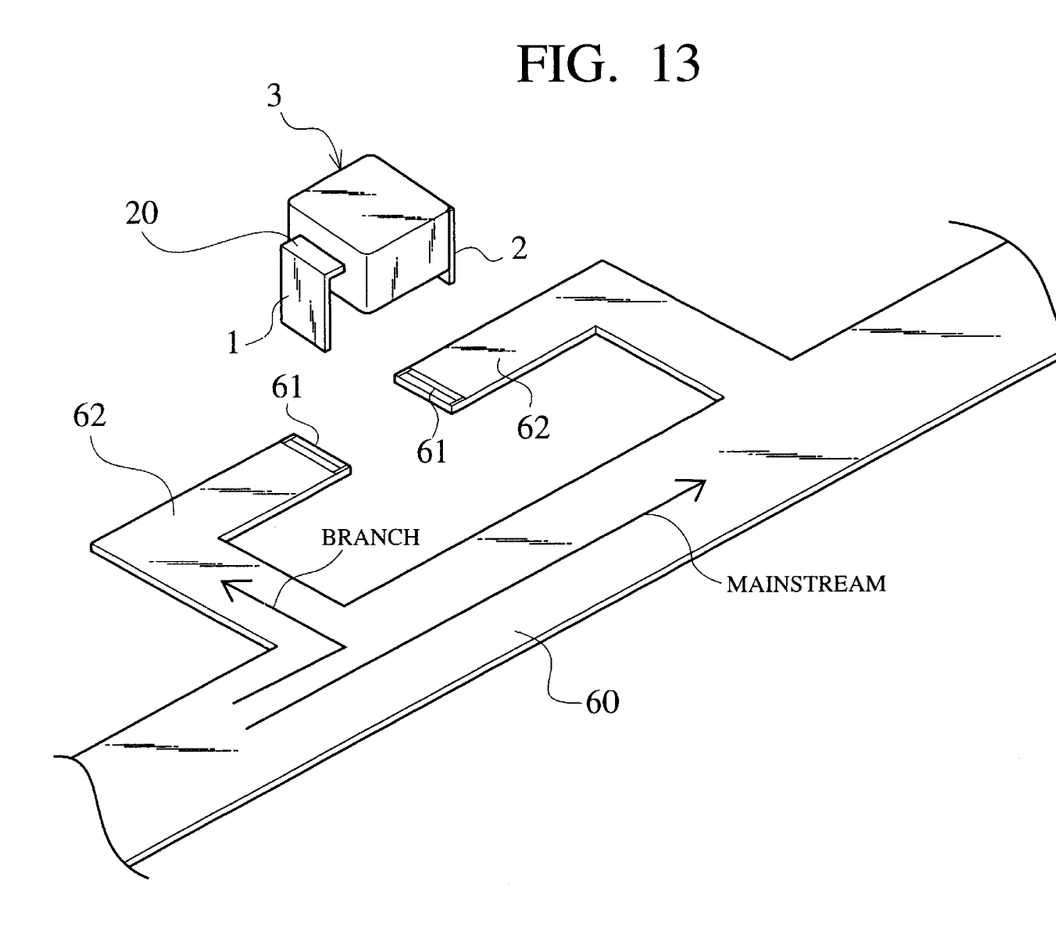
FIG. 13 is a perspective view of a second connecting example (branch type) in an electric circuit according to a fifth embodiment of the invention.

FIG. 13 shows a second connecting example (branch type). In this example, the wire conductor 60 includes branch conductors branching off from the wire conductor 60, and tip ends of the branch conductors are formed with the connecting portions 61. The connecting portions 61 may be formed in the same manner as those shown in FIGS. 10 to 12.

In this case, since a branch current flowing from the branch conductors through the current sensor 3 is smaller than a current flowing through the entire wire conductor 60, it is possible to detect a large current using the Hall element 30 having a low saturation point. Since the current sensor 3 detects a branch current, a current value detected by the current sensor 3 is corrected when a current flowing through the entire wire conductor 60 is to be obtained.

Although the wire conductor 60 and the current sensor 3 are connected to each other by fitting the terminals 1 and 2 of the current sensor 3 to the connecting portions 61 formed on the wire conductor 60 in the fifth embodiment, the terminals 1 and 2 of the current sensor 3 may be connected to the wire conductor 60 by screws.

What is claimed is:

1. A current sensor comprising:

a cabinet;

a sensor conductor partially accommodated in said cabinet and secured to said cabinet, and said sensor conductor having both ends pulled out from said cabinet;

a magnetic-electric power converting element accommodated in said cabinet, secured to said cabinet, and disposed substantially in the center of said sensor conductor inside said cabinet; and square magnetic-force collecting cores respectively disposed on said cabinet such that magnetic-force sensing faces of said magnetic-electric power converting element are disposed between said square magnetic-force collecting cores.

2. A current sensor according to claim 1, wherein both ends of said sensor conductor are formed to have compatibility with an end of a fuse.

3. A current sensor according to claim 1, further comprising a display unit for displaying information corresponding to an electric signal from said magnetic-electric power converting element, wherein a male connector-like connecting portion is attachably fitted with a female connector-like connecting portion provided with said sensor conductor.

4. An electric circuit comprising:

a current sensor including a cabinet, a sensor conductor partially accommodated in said cabinet and secured to said cabinet, said sensor conductor having both ends pulled out from said cabinet;

a magnetic-electric power converting element accommodated in said cabinet and secured to said cabinet, and disposed substantially in the center of said sensor conductor inside said cabinet;

square magnetic-force collecting cores respectively disposed on said cabinet such that magnetic-force sensing faces of said magnetic-electric power converting element are disposed between said square magnetic-force collecting cores; and a wire conductor used for wiring of said electric circuit and having fitting portions to be fitted to terminals of said sensor conductor of said current sensor.

5. An electric circuit according to claim 4, wherein said wire conductor have branch path formed with fitting portions, said terminals of said sensor conductor of said current sensor are fitted to said fitting portions formed on said branch path.

* * * * *